United States Patent
Tisserand et al.

(10) Patent No.: US 11,862,658 B2
(45) Date of Patent: Jan. 2, 2024

(54) MULTISPECTRAL IMAGING SENSOR PROVIDED WITH MEANS FOR LIMITING CROSSTALK

(71) Applicant: SILIOS TECHNOLOGIES, Rousset (FR)

(72) Inventors: Stephane Tisserand, Aubagne (FR); Laurent Roux, Marseilles (FR); Marc Hubert, Fuveau (FR); Vincent Sauget, Aix en Provence (FR)

(73) Assignee: SILIOS TECHNOLOGIES, Rousset (FR)

( * ) Notice: Subject to any disclaimer, the term of this patent is extended or adjusted under 35 U.S.C. 154(b) by 512 days.

(21) Appl. No.: 17/264,166

(22) PCT Filed: Jul. 29, 2019

(86) PCT No.: PCT/FR2019/051864
§ 371 (c)(1),
(2) Date: Jan. 28, 2021

(87) PCT Pub. No.: WO2020/025888
PCT Pub. Date: Feb. 6, 2020

(65) Prior Publication Data
US 2021/0288087 A1   Sep. 16, 2021

(30) Foreign Application Priority Data

Jul. 30, 2018 (FR) ...................... 1800822

(51) Int. Cl.
*H01L 27/146* (2006.01)
*H04N 25/75* (2023.01)
(Continued)

(52) U.S. Cl.
CPC ...... *H01L 27/1464* (2013.01); *H01L 27/1465* (2013.01); *H01L 27/14634* (2013.01);
(Continued)

(58) Field of Classification Search
CPC ........... H01L 27/1464; H01L 27/14634; H01L 27/1465; H01L 27/14643; H04N 23/11; H04N 25/60; G01J 2003/2806
See application file for complete search history.

(56) References Cited

U.S. PATENT DOCUMENTS

| | | |
|---|---|---|
| 2003/0006416 A1 | 1/2003 | Dudoff et al. |
| 2006/0209413 A1 | 9/2006 | Kim et al. |

(Continued)

FOREIGN PATENT DOCUMENTS

| | | |
|---|---|---|
| FR | 2 904 432 A1 | 2/2008 |
| WO | 2017/187029 A1 | 11/2017 |

OTHER PUBLICATIONS

Heng-Jing Tang et al., "The novel dual-waveband SWIR InGaAs FPAs with monolithic integration filter microstructure", Proc. of SPIE, 2014, 6 pgs., vol. 8982.

(Continued)

*Primary Examiner* — David Vu
(74) *Attorney, Agent, or Firm* — Sughrue Mion, PLLC

(57) ABSTRACT

A hybrid multispectral imaging sensor, characterized in that it comprises a photosensitive backside-illumination detector (DET) that is made on a substrate (100) made of InP, and that is formed of a matrix of pixels (105, P1, P2, P3) that are themselves made in a structure based on InGaAs (103), and a filter module (MF) that is formed of a matrix of elementary filters (λ1, λ2, λ3) reproducing said matrix of pixels, and that is mounted into contact with said substrate (100), said substrate (100) made of InP having a thickness less than 50 μm, and preferably less than 30 μm.

12 Claims, 4 Drawing Sheets

(51) Int. Cl.
  *H04N 25/60* (2023.01)
  *H04N 23/11* (2023.01)

(52) U.S. Cl.
  CPC ............. *H04N 23/11* (2023.01); *H04N 25/60* (2023.01); *H04N 25/75* (2023.01)

(56) References Cited

U.S. PATENT DOCUMENTS

| | | | |
|---|---|---|---|
| 2014/0268146 A1 | 9/2014 | Hinnrichs | |
| 2018/0372546 A1* | 12/2018 | Enichlmair | G01J 3/51 |
| 2019/0179067 A1* | 6/2019 | Houck | G02B 5/26 |
| 2023/0080285 A1* | 3/2023 | Houck | G02B 5/283 |
| | | | 359/584 |

OTHER PUBLICATIONS

Wang Xu-Quan et al., "Integrated Linear Variable Filter / InGaAs Focal Plane Array Spectral Micro-module and Its Wavelength Calibration", Acta Photonica Sinica, May 2018, 6 pgs., vol. 47, No. 5.

Tara Martin et al., "640×512 InGaAs focal plane array camera for visible and SWIR imaging", Proc. of SPIE, May 2005, 10 pgs., vol. 5783, No. 5.

Marshall J. Cohen et al., "A Thin Film Indium Gallium Arsenide Focal Plane Array for Visible and Near Infrared Hyperspectral Imaging", 1999 IEEE Leos Annual Meeting Conference Proceedings, Nov. 8, 1999, 2 pgs., vol. 2.

Bora Onat et al., "A Solid-State Hyperspectral Imager for Real-time Standoff Explosives Detection using Shortwave Infrared Imaging", Proc. of SPIE, Apr. 30, 2009, 11 pgs., vol. 7310.

French Search Report for 1800822 dated Jun. 3, 2019.

International Search Report for PCT/FR2019/051864 dated Nov. 28, 2019 (PCT/ISA/210).

* cited by examiner

MULTISPECTRAL IMAGING SENSOR PROVIDED WITH MEANS FOR LIMITING CROSSTALK

CROSS REFERENCE TO RELATED APPLICATIONS

This application is a National Stage of International Application No. PCT/FR2019/051864 filed Jul. 29, 2019, claiming priority based on French Patent Application No. 18 00822 filed Jul. 30, 2018.

The present invention relates to a multispectral imaging sensor provided with means for limiting crosstalk.

Spectrometric analysis aims in particular to identify chemical constituents making up a solid, liquid, or gaseous medium. This involves recording the absorption spectrum of the medium in reflection or in transmission. The light that interacts with said medium is absorbed in certain wavelength bands. Such selective absorption is a signature for some or all of the constituents of the medium. The range of wavelengths of the spectrum to be measured may cover the ultraviolet range and/or the visible range and/or the (near, mid, or far) infrared range.

Such an analysis is commonly performed by means of a spectrometer.

Certain spectrometers use at least one Fabry-Pérot filter.

It should be noted or recalled that such a filter is constituted by a parallel-face "plate" of a material (usually of low refractive index, such as air, silica, etc.) forming a "spacer" between two mirrors. Such a filter is often made by thin layer deposition in a vacuum. Thus, for a filter having its passband centered on a central wavelength $\lambda$, the first mirror consists of m alternations of layers of a high refractive index material H and of a low refractive index material B, each layer having an optical thickness of $\lambda/4$. The mirror may also be a semi-reflective thin metal layer. The spacer frequently consists of 2 layers of the low refractive index material B, each layer having an optical thickness of $\lambda/4$. In general, the second mirror is symmetrical to the first mirror. Changing the geometrical thickness of the spacer enables the filter to be tuned to the central wavelength for which the optical thickness is equal to a multiple of $\lambda/2$.

One known technique is based on using a filter module having one filter per band to be analyzed. If the number of bands is n, then making n filters requires n distinct vacuum deposition fabrication operations. The cost is therefore very high (and almost proportional to the number n of bands) for short production runs and becomes genuinely advantageous only for runs that are sufficiently long. Furthermore, in such a configuration, the possibilities of miniaturization are also very limited, and it is difficult to envisage providing a large number of filters.

One alternative that has been developed more recently makes use of a filter module of the Fabry-Pérot type in which the two mirrors are no longer parallel-face mirrors but are wedge-shaped as seen in profile in a plane perpendicular to the substrate. In that plane, referenced Oxy, the axes Ox and Oy are respectively colinear with and perpendicular to the substrate, with the thickness along Oy of the spacer varying linearly as a function of the position along Ox where it is measured.

Document US 2006/0209413 teaches of a wavelength spectroscopy device including such a filter module. It follows that, with that device, the wavelength varies continuously along the axis Ox.

Those various technologies make it possible to analyze an item with satisfactory spectral resolution when a continuous spectrum is desired.

They are also well suited to situations in which a finite number of relatively narrow passbands (i.e. a spectrum that is discrete rather than a spectrum that is continuous) suffices for identifying the constituents that are being sought.

However, those technologies consider the item to be analyzed as an entity that is indissociable, i.e. that is not resolved in three dimensions, and they are not suitable for identifying variations in optical transmission or reflection within the item itself.

Thus, Document FR 2 904 432 teaches of an optical filtering matrix structure and of an associated image sensor. In the document, the idea is to obtain different colors. Indeed, based on three fundamental colors taken from the visible spectrum (red, green, and blue), it is possible to reproduce most colors.

In that document, a matrix of filters is used that is arranged at the surface of a matrix of detectors. In that document, the matrix of filters is a "Bayer" matrix, but that is of little importance for the present invention. The matrix of detectors is an Active Pixel Sensor Complementary Metal Oxide Semiconductor (APS CMOS) matrix. That matrix is implemented on a semiconductor substrate at the surface of which photosensitive regions are arranged, as are electronic circuits and electrical connections.

On an individual pixel, the photosensitive region represents only a fraction of its total area, the remainder of the area being occupied by control electronics. It is therefore necessary to provide microlenses, one per pixel, for focusing the incident light onto the photosensitive region of the pixel. The matrix of filters is arranged in contact with the detector so that the resulting assembly is in the form of a component consisting of a stack comprising detectors-filters-microlenses.

Specifically, it is not possible to envisage depositing the matrix of filters on the microlenses because the topology of said microlenses is very marked. Furthermore, the microlenses are made of resin and it therefore appears difficult to produce an inorganic filter on an organic material.

Unfortunately, the aperture angle of the incident beam on the filters is large when they are arranged under the microlenses. The response of the filters is closely tied to that angle of incidence. This leads to a modification in the spectral response.

On this topic, Document US 2014/0268146 teaches of an array of microlenses with integral bandpass filters to which a detector is added. Furthermore, there is a deflector between the array of microlenses or "lenslets" and the detector.

In order to avoid this problem of angle of incidence on the filters, it could be envisaged to omit the microlenses. However, the photosensitive region has an area that is small compared with the total area of the pixel. The gain in sensitivity procured by the microlens is about 50%. It therefore seems inappropriate to lose sensitivity by omitting the microlenses.

It should also be mentioned that the fabrication yield of such a component is relatively low. The overall yield is substantially equal to the product of the following three yields:
  detector fabrication yield;
  filter matrix fabrication yield; and
  microlens array fabrication yield.

As a result, increasing the number of fabrication operations lowers the overall fabrication yield accordingly.

Therefore, Document WO2017/187029 discloses a multispectral imaging device that does not suffer from the above-mentioned limitations.

That multispectral imaging device comprises:
a photosensitive detector formed by a matrix of pixels;
an array of microlenses reproducing said matrix of pixels; and
a filter module formed by a matrix of individual filters reproducing said matrix of pixels;
the array of microlenses being arranged directly in contact with the detector; and
the filter module being made on a substrate that is mounted into contact with the array of microlenses.

The problem with that detector is that it is produced using CMOS (Silicon) technology and therefore that it is designed only for the visible and near infrared spectra, i.e. approximately in the range 400 nanometers (nm) to 1000 nm.

In order to extend the spectrum at the infrared end, it is now common to use a detector made of indium gallium arsenide (InGaAs). It is then possible to achieve 2500 nm.

With reference to FIG. 1, such a detector DET is thus made starting from the backside face on which the illumination takes place.

A substrate 100, e.g. made of indium phosphide (InP) of a thickness of about 300 micrometers (μm), has a backside face 101 that is illuminated by incident radiation. On the frontside face 102 of the substrate is an epitaxially grown structure 103 based on InGaAs and photosensitive, on which structure there are a plurality of pixels, only one of which (105) is shown in full. On said pixel 105 is a first metal pad 107 designed to collect the electrons that have been generated within said pixel. The pad 107 is shown at this place for making the figure easier to understand at the pixel, but it may also be positioned elsewhere, the charges generated within the pixel then being routed to it via metal tracks.

The pixel 105 is read by a read circuit 110 implemented on a silicon substrate. Thus, on that substrate, there is a second metal pad 111 that is connected via a "bump" 112, i.e. a ball of solder, to the first metal pad 107.

Theoretically, it would therefore be possible to mount a filtering module into contact with the InP substrate. Unfortunately, it transpires that such a device does not function. Specifically, since the size of a pixel is typically about 10 μm and since the distance imparted by the thickness of the InP substrate is typically about 300 μm, the crosstalk is so high that it prevents measurement signals that are usable from being obtained from the pixels.

An object of the present invention is thus to provide a hybrid multispectral imaging sensor that functions for wavelengths greater than 1000 nm and ranging up to 2200 nm.

The invention provides an infrared multispectral imaging sensor comprising:
a photosensitive backside-illumination detector that is made on a first substrate made of InP and having a backside face and a frontside face, and that is formed of a matrix of pixels that are themselves made in a structure based on InGaAs, and deposited by epitaxy on the frontside face of the first substrate made of InP; and
a filter module that is formed of a matrix of elementary filters reproducing said matrix of pixels, and that is constituted by a stack made up of a first mirror and of a second mirror that are separated by a spacer, said filter module defining a plurality of filter cells, each of which comprises at least two filters, wherein said filter module is formed on a second substrate on which the first mirror, the spacer, and the second mirror have been deposited, in that order;

the second mirror is mounted into contact with said first substrate, thereby forming a hybrid multispectral imaging sensor that functions for wavelengths greater than 1000 nm and ranging up to 2200 nm; and
said first substrate made of InP has:
a thickness less than 50 μm, preferably less than 30 μm, and even more preferably less than 10 μm.

Crosstalk phenomena are thus considerably minimized.

An article by Bora M. Onat entitled "A Solid-State Hyperspectral Imager for Real-Time Standoff Explosives Detection using Shortwave Infrared Imaging", published in Non-Intrusive Inspection Technologies II, edited by Brandon W. Blackburn, Proc. of SPIE, Vol. 7310, 731004, discloses a multispectral imaging system functioning in the infrared range.

A scientific article by Heng-jing Tang entitled "The novel dual-waveband SWIR InGaAs FPAs with monolithic integration filter microstructure" published in Optical Components and Materials, Proceedings of Spie, Vol. 8982, describes an optical detector based on photodiodes formed in a layer of InGaAs deposited by epitaxy on an InP substrate and including Fabry-Pérot cavities formed in layers deposited by evaporation on the same InP substrate. However, that sensor is obtained by monolithic integration.

Patent Document US 2003/0006416 A1 discloses a method of integrating an electronic chip with a backside active optical chip.

An article by Wang Xu-quan entitled "Integrated Linear Variable Filter/InGaAs Focal Plane Array Spectral Micro-Module and its Wavelength Calibration" published in Acta Photonica Sinica, Vol. 47 No. 5, May 2018, discloses an integrated module with a linear variable filter and an InGaAs detection matrix.

An article by Tara Martin entitled "640×512 InGaAs focal plane array camera for visible and SWIR imaging" published in Proc. of SPIE, Vol. 5783, pp 13-20, discloses an InGaAs detection matrix.

An article by Marshall J. Cohen entitled "A Thin Film Indium Gallium Arsenide Focal Plane Array for Visible and Near Infrared Hyperspectral Imaging", published in 1999 IEEE LEOS Annual Meeting Conference Proceedings, IEEE Laser and Electro-Optics Society, Vol. 2, 8 Nov. 1999, discloses a heteroepitaxial structure with an InGaAs active layer and an InP cathode under said layer.

Advantageously, the filter module of the sensor of the invention is adhesively bonded to said detector around its periphery.

Preferably, the filter module is provided with alignment patterns.

In particular, the filter module and the photosensitive detector that is made on the InP substrate are fabricated independently during parallel fabrication methods in such a manner as to form two separate elements, and then the filter module is mounted into contact with the InP substrate and is fastened thereto by fastening means such as adhesive, so that a hybrid structure is obtained that comprises the filter module, the InP substrate, and the photosensitive detector, in that order.

Thus, the imaging sensor of the invention functions as a backside sensor, i.e. radiation to be detected passes through the InP substrate of the photosensitive detector before it irradiates said detector. For example, with the filter module being constituted by two mirrors separated by a spacer, and with said filter module comprising a plurality of filter cells, each of said filter cells comprises at least two filters.

Thus, at least one of said filters has a bandpass transfer function.

In accordance with an additional characteristic, at least some of said filter cells are in alignment in a first strip.

Similarly, at least some of said filter cells are in alignment in a second strip that is parallel to and disjoint from the first strip.

In a preferred embodiment, at least two of said filters that are adjacent are separated by a crosstalk barrier.

Optionally, at least one of said filters is panchromatic.

Normally, the detector is mounted onto a read circuit.

Advantageously, the read circuit is integrated using CMOS technology.

In a first option, the substrate made of InP is made thinner by polishing.

In a second option, the substrate made of InP is made thinner by etching.

The present invention appears in greater detail from the following description of embodiments given by way of illustration and with reference to the accompanying figures, in which:

FIG. 2 is a theoretical diagram of a one-dimensional filter cell, and more specifically:

Elements present in more than one of the figures are given the same reference in all of them.

The description begins with a filter module that has a plurality of generally identical filter cells formed on a substrate SUB.

Figure 2A:
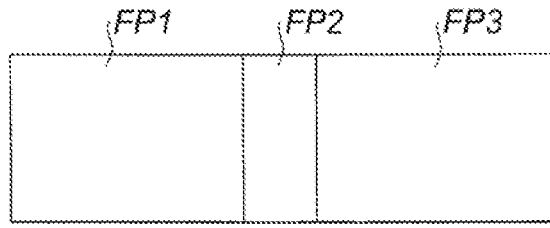
FIG. 2a is a plan view of said cell.
Figure 2B:
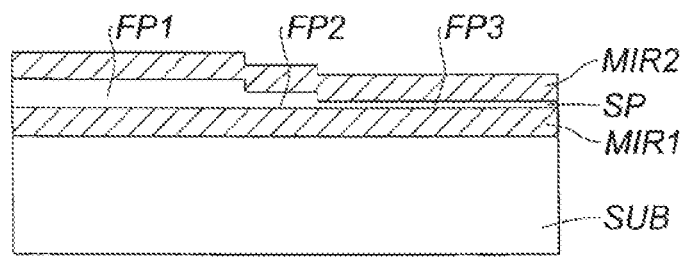
FIG. 2b is a section view of said cell.

With reference to FIGS. 2a and 2b, a filter cell comprises three interference filters of the Fabry-Pérot type FP1, FP2, FP3 in successive alignment so as to form a strip.

The cell is constituted by a stack on said substrate SUB of the filter module, the substrate being made of glass, or of silica, or of silicon, for example, and the stack being made up of a first mirror MIR1, of a spacer SP, and of a second mirror MIR2.

The spacer SP, which defines the central wavelength of each filter, is thus constant for any given filter and varies from one filter to another. Its profile is staircase-shaped since each filter has a surface that is substantially rectangular.

An advantageous method of making the filter module using thin layer technology is given by way of example.

Figure 3A:
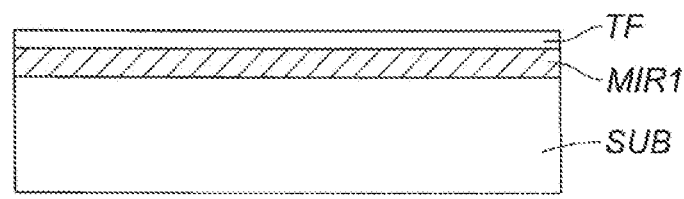
FIGS. 3a to 3c show three steps in making an embodiment of a filter module.

With reference to FIG. 3a, the method starts by depositing the first mirror MIR1 on the substrate SUB, followed by a dielectric layer or a set of dielectric layers TF for defining the spacer SP. The mirror is either metallic or dielectric.

Figure 3B:
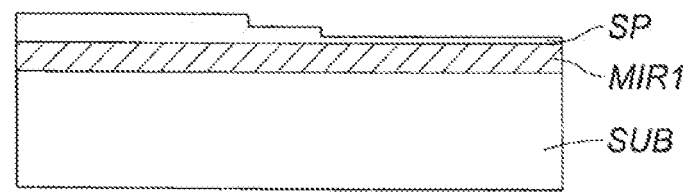

With reference to FIG. 3b, the dielectric TF is etched:
initially at the second and third filters FP2 and FP3, in order to define the thickness of the spacer SP at the second filter FP2; and
subsequently at the third filter FP3, in order to define the thickness of said spacer at the third filter.

At the first filter FP1, the spacer SP has the deposition thickness.

Figure 3C:
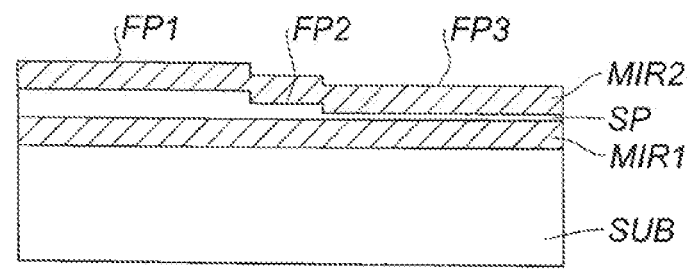

With reference to FIG. 3c, the second mirror MIR2 is deposited on the spacer SP in order to finalize the three filters.

The spacer SP may be obtained by depositing a dielectric TF followed by successive etching as described above, but it may also be obtained by depositing a plurality of thin layers in succession.

By way of example, it is possible to scan the range of wavelengths from 900 nm to 2000 nm by modifying the optical thickness of the spacer.

It should be observed at this point that the thickness of the spacer needs to be small enough to obtain only one transmission band in the range to be probed. Specifically, the greater the thickness, the greater the number of wavelengths that satisfy the condition [ne=k $\lambda/2$].

The invention thus enables a set of aligned filters to be made, which filters can thus be referenced in one-dimensional space.

Figure 4:
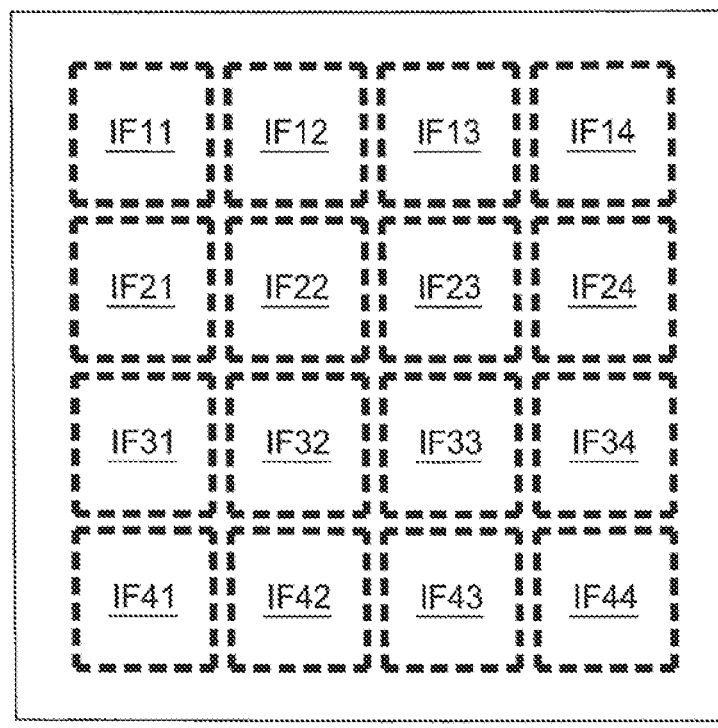
FIG. 4 is a theoretical diagram of a two-dimensional filter module.

With reference to FIG. 4, the invention also enables the filter cells to be organized in two-dimensional space. Such an organization is often referred to as a matrix organization.

Each one of four identical horizontal strips comprises four cells. The first strip, i.e. the strip that is shown at the top of the figure, corresponds to the first row of a matrix and comprises cells IF11 to IF14. The second, third, and fourth strips respectively comprise cells IF21 to IF24, filters IF31 to IF34, and cells IF41 to IF44.

The organization is said to be a matrix organization because cell IFjk belongs to the $j^{th}$ horizontal strip and also to a $k^{th}$ vertical strip that comprises cells IF1k, IF2k, ..., IF4k.

Figure 5:
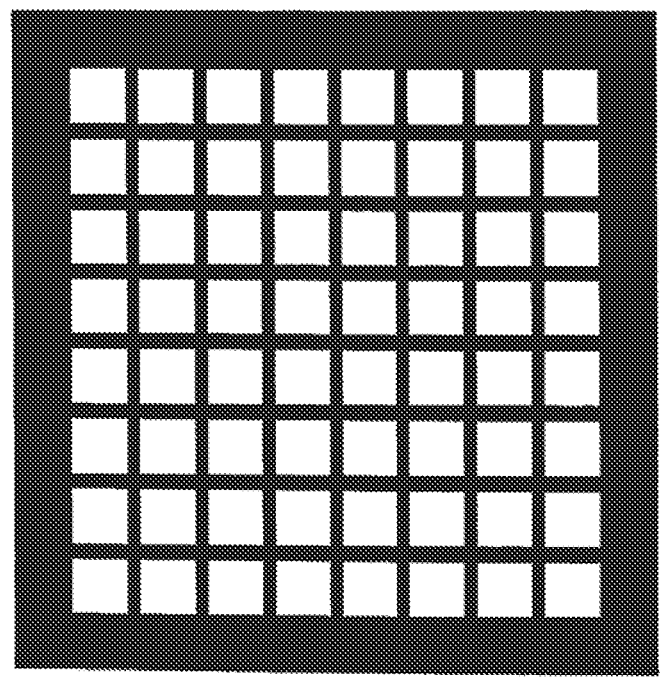
FIG. 5 is a diagram showing a filter module having 64 filters and having a screening grid.

With reference to FIG. 5, it is desirable for the various filters of the filter module to be well separated in order to avoid partial overlap of one filter on a filter adjacent to it, and in order to minimize any problem of crosstalk. To achieve this, it is possible to add a grid over the filter module (the grid being shown in black in the figure) so as to form a crosstalk barrier for delimiting all of the filters. The grid should be absorbent. By way of example, an absorbent grid may be made by depositing and etching a black chromium (chromium+chromium oxide) while a reflective grid may be made by depositing and etching chromium.

Figure 6:
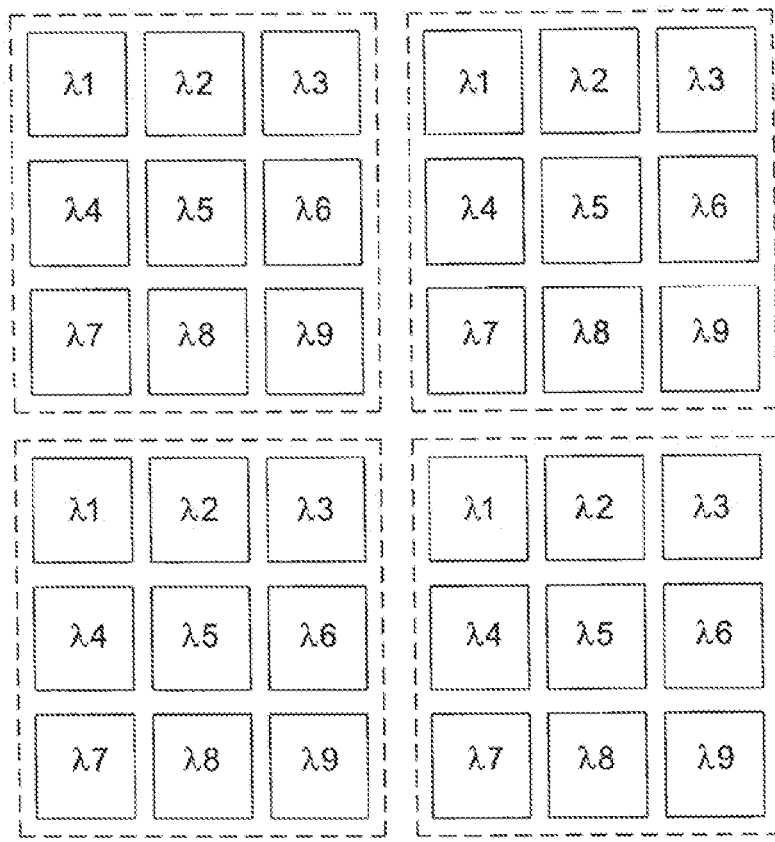
FIG. 6 is a diagram of a filter module in which each of its cells has nine filters.

With reference to FIG. 6, each filter cell now has 9 filters. Each of these cells is in the form of a square within which a corresponding filter lies that is tuned to a distinct wavelength $\lambda 1, \lambda 2, \lambda 3, \lambda 4, \ldots, \lambda 9$.

In this figure, for reasons of clarity, the spacing between the cells has been voluntarily increased compared with the spacing between two filters. Naturally, in reality, these spacings are identical.

The filter module is thus associated with a detector capable of measuring the light fluxes produced by the various filters.

Figure 1:
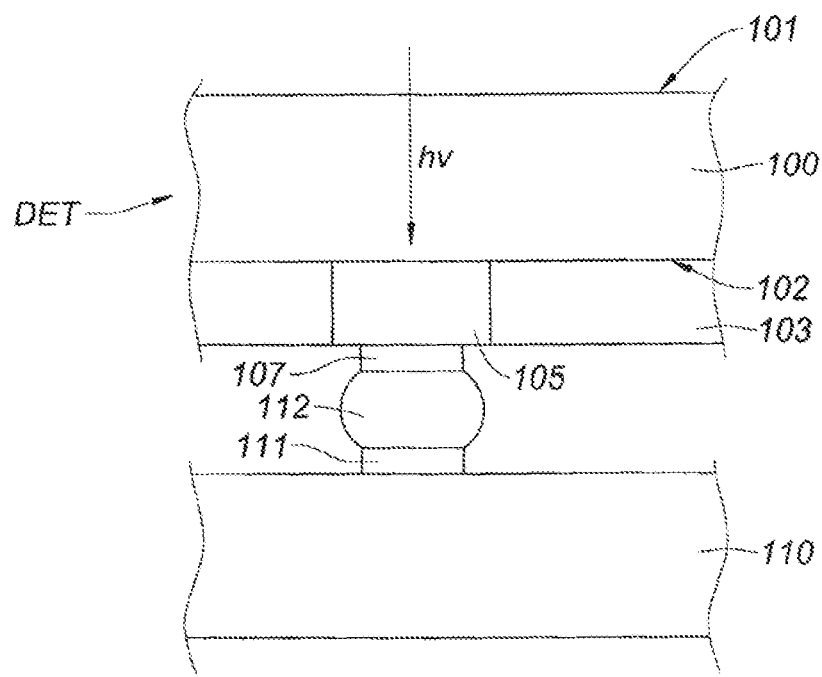
FIG. 1 is a diagram of a known detector made on an InP substrate.
Figure 7:
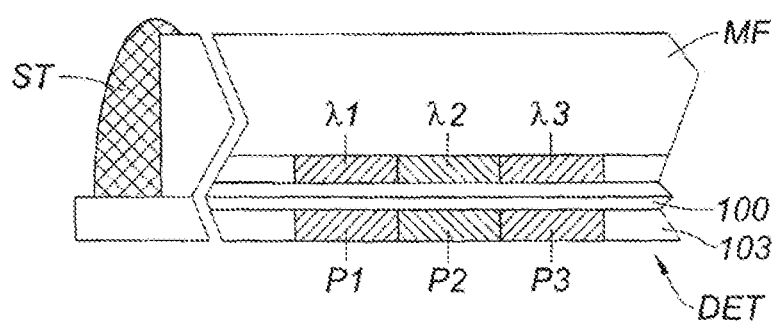
FIG. 7 is a section diagram of a device of the invention.

With reference to FIG. 7, the filter module MF that is shown in FIG. 6 is reproduced.

The detector DET is made using InGaAs technology on an InP substrate as described in the introduction of the present application.

The filter module MF comes to bear against the detector DET in contact with the InP substrate so that the filters $\lambda 1$, $\lambda 2, \lambda 3$ are facing the pixels P1, P2, P3 and are interposed between the InP substrate of the detector DET and the substrate SUB of the filter module.

In this way, the distance separating the pixels from the filters is minimized, and can be reduced to the thickness of the InP substrate, and crosstalk is also minimized.

Positioning this module MF is performed by means of alignment patterns, which is a technique known to the person skilled in the art of photolithography and is therefore not described in any further detail below.

The filter module MF is fastened to the detector DET by means of a margin of adhesive ST.

In particular, the filter module MF is made on a first type of substrate, e.g. made of glass, silica, or silicon, and the detector DET is made on a second type of substrate, which is made of InP in this example, these two elements as assembled together forming the hybrid structure of the imaging sensor.

For reasons of clarification, it is specified that the pixels commonly have a size of about 15 micrometers.

Furthermore, it is naturally well understood that the InP substrate 100 needs to be made thinner. To achieve this, two solutions are proposed.

The first solution consists in polishing the substrate mechanically down to a thickness of approximately in the range 20 μm to 30 μm.

Figure 8:
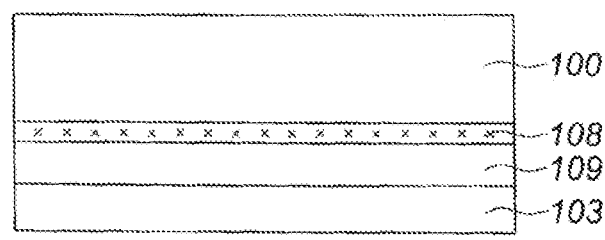
FIG. 8 shows a device designed to form a detector.

In the second solution, with reference to FIG. 8, a stop layer 108 is grown on the InP substrate, and then a thin layer 109 of InP is grown on the stop layer by epitaxy.

The active layer 103 of InGaAs is then grown on said thin layer 109.

It is thus necessary to etch the substrate 100 to the stop layer 108 by selective etching, and then to etch said stop layer also by selective etching. This results in obtaining the required thickness for the InP backing 109.

The above-described embodiments of the invention have been chosen because of their concrete nature. However, it is not possible to list exhaustively all possible embodiments covered by the invention. In particular, it is naturally possible to replace any of the means described by equivalent means without going beyond the ambit of the present invention.

The invention claimed is:

1. An infrared multispectral imaging sensor comprising:
   a photosensitive backside-illumination detector (DET) that is made on a first substrate (100) made of InP, and having a backside face (101) and a frontside face (102), and that is formed of a matrix of pixels (105, P1, P2, P3) that are themselves made in a structure (103) based on InGaAs and deposited by epitaxy on the frontside face of the first substrate (100) made of InP; and
   a filter module (MF) that is formed of a matrix of elementary filters ($\lambda 1, \lambda 2, \lambda 3$) reproducing said matrix of pixels, and that is constituted by a stack made up of a first mirror (MIR1) and of a second mirror (MIR2) that are separated by a spacer (SP), said filter module defining a plurality of filter cells (IF11, IF12, . . . , IF44), each of which comprises at least two filters (FP1, FP2, FP3);

said infrared multispectral imaging sensor being characterized in that:
   said filter module (MF) is formed on a second substrate (SUB) on which the first mirror (MIR1), the spacer (SP), and the second mirror (MIR2) have been deposited, in that order;
   the second mirror (MIR2) is mounted into contact with said first substrate (100), thereby forming a hybrid multispectral imaging sensor that functions for wavelengths greater than 1000 nm and ranging up to 2200 nm; and
   said first substrate (100) made of InP has a thickness less than 50 μm, and preferably less than 30 μm.

2. A sensor according to claim 1, characterized in that said filter module (MF) is adhesively bonded to said detector (DET) around its periphery.

3. A sensor according to claim 1, characterized in that said filter module (MF) is provided with alignment patterns.

4. A sensor according to claim 3, characterized in that at least one of said filters (FP1, FP2, FP3) has a bandpass transfer function.

5. A sensor according to claim 4, characterized in that at least some of said filter cells (IF11, IF12, IF13, IF14) are in alignment in a first strip.

6. A sensor according to claim 5, characterized in that at least some of said filter cells (IF21 to IF24) are in alignment in a second strip that is parallel to and disjoint from the first strip.

7. A sensor according to any one of claim 4, characterized in that at least two of said filters (FP1, FP2, FP3) that are adjacent are separated by a crosstalk barrier.

8. A sensor according to any one of claim 4, characterized in that at least one of said filters (FP1, FP2, FP3) is panchromatic.

9. A sensor according to claim 1, characterized in that said detector (DET) is mounted onto a read circuit (110).

10. A sensor according to claim 9, characterized in that said read circuit (110) is integrated using CMOS technology.

11. A sensor according to claim 1, characterized in that said substrate (100) made of InP is made thinner by polishing.

12. A sensor according to any one of claim 1, characterized in that said substrate (100) made of InP is made thinner by etching.

* * * * *